United States Patent
Druijf et al.

(10) Patent No.: US 6,645,817 B2
(45) Date of Patent: Nov. 11, 2003

(54) METHOD OF MANUFACTURING A SEMICONDUCTOR DEVICE COMPRISING MOS-TRANSISTORS HAVING GATE OXIDES OF DIFFERENT THICKNESSES

(75) Inventors: Klaas Gerbrand Druijf, Nijmegen (NL); Hendrik Hubertus Van Der Meer, Nijmegen (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/185,883

(22) Filed: Jun. 28, 2002

(65) Prior Publication Data

US 2003/0045058 A1 Mar. 6, 2003

(30) Foreign Application Priority Data

Jul. 3, 2001 (EP) ............................. 01202553

(51) Int. Cl.[7] .............................................. H01L 21/00
(52) U.S. Cl. ....................................... 438/275; 438/981
(58) Field of Search ................................ 438/981, 275, 438/257–267

(56) References Cited

U.S. PATENT DOCUMENTS

| | | | | |
|---|---|---|---|---|
| 4,420,872 A | * | 12/1983 | Solo de Zaldivar | 438/227 |
| 5,371,026 A | * | 12/1994 | Hayden et al. | 438/275 |
| 5,595,922 A | * | 1/1997 | Tigelaar et al. | 438/587 |
| 5,672,521 A | * | 9/1997 | Barsan et al. | 438/276 |
| 6,198,140 B1 | | 3/2001 | Muramoto et al. | 257/392 |
| 6,258,673 B1 | * | 7/2001 | Houlihan et al. | 438/275 |
| 2001/0039093 A1 | * | 11/2001 | Oohashi | 438/275 |

FOREIGN PATENT DOCUMENTS

| EP | 0713249 A1 | 5/1996 | ....... H01L/21/8234 |
|---|---|---|---|
| EP | 0966036 A2 | 12/1999 | |

* cited by examiner

Primary Examiner—Richard Booth
(74) Attorney, Agent, or Firm—Aaron Waxler

(57) ABSTRACT

Method of manufacturing a semiconductor device comprising MOS-transistors of a first type (A) having a gate oxide (3) of a first thickness and MOS-transistors of a second type (B) having a gate oxide (10) of a second, greater thickness. In this method, active regions (4) and field oxide regions (5) are formed in a silicon body (1). Then a layer of gate oxide (6) of said first thickness is formed on the active regions, on which a layer (7,8) of an electrode material is deposited. In the layer of electrode material, the gate electrodes (9) for the transistors of the second type are formed. Then an oxidation treatment is carried out, in which the thickness of the gate oxide under said gate-electrodes increases to the desired second thickness (10). During these processes, the electrode layer on the active regions of the MOS-transistors of the first type is not disturbed. The gate electrodes for the transistors of the first type are formed after the oxidation treatment. Thus a semiconductor device comprising MOS-transistors having gate oxides of different thicknesses can be manufactured in a simple manner.

6 Claims, 3 Drawing Sheets

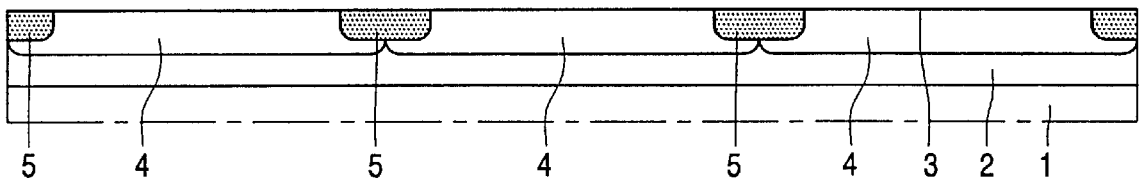
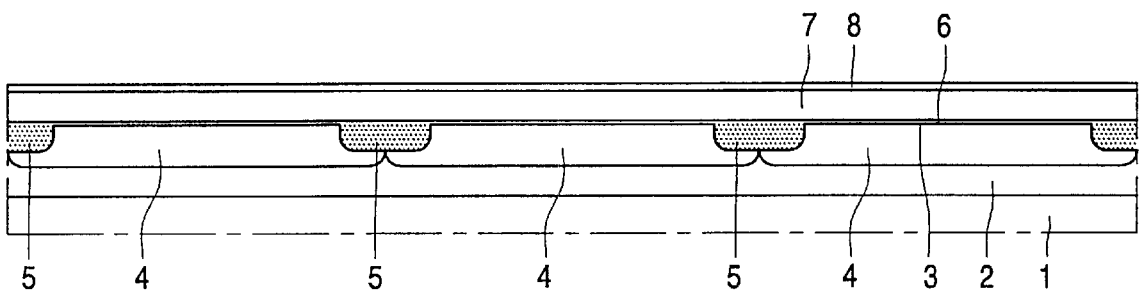
FIG. 6
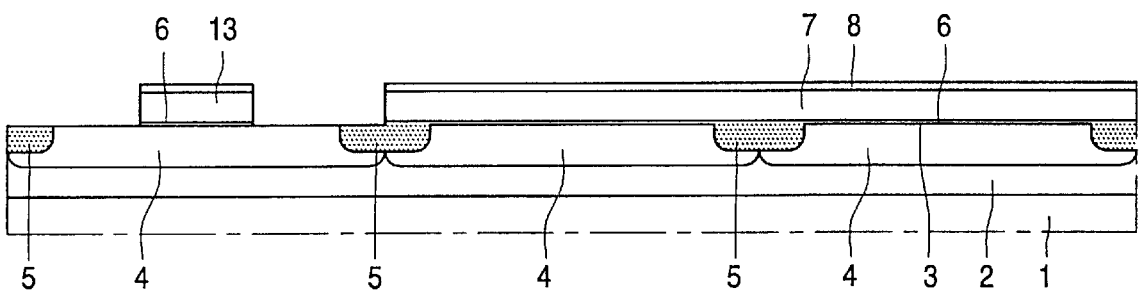
FIG. 7
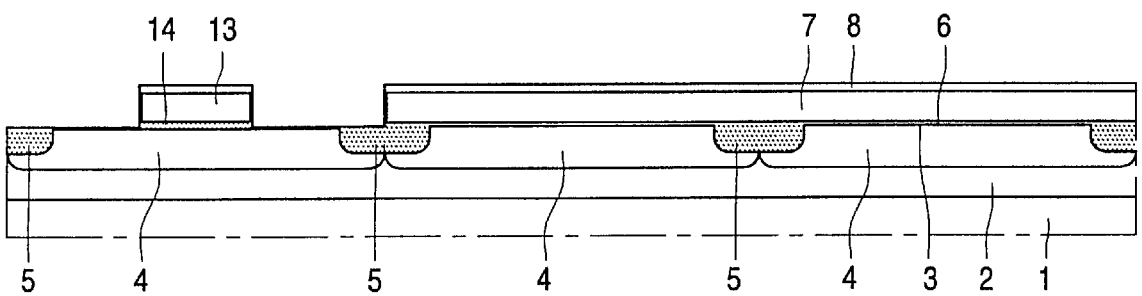
FIG. 8
FIG. 9

METHOD OF MANUFACTURING A SEMICONDUCTOR DEVICE COMPRISING MOS-TRANSISTORS HAVING GATE OXIDES OF DIFFERENT THICKNESSES

The invention relates to a method of manufacturing a semiconductor device comprising MOS-transistors having gate oxides of different thicknesses, including MOS-transistors of a first type having a gate oxide of a first thickness and MOS-transistors of a second type having a gate oxide of a second, greater thickness, in which method active regions and field oxide regions isolating said active regions from each other are formed in a silicon body, adjacently to a surface thereof, after which a layer of gate oxide of said first thickness is formed on said active regions, on which a layer of an electrode material is deposited, in which the gate electrodes for the MOS-transistors of said second type are formed, after which the thickness of the gate oxide under said gate-electrodes is increased to the second, larger thickness by means of a thermal oxidation treatment.

Such a method is used in practice for manufacturing semiconductor devices, which comprise an integrated circuit including circuits for different functions. In order to realize these functions, MOS-transistors having gate oxides of different thicknesses are required. In circuits which are made in "0.18 $\mu$m processes" (processes for manufacturing semiconductor devices in which photolithographic techniques are used by means of which smallest dimensions of 0.18 $\mu$m can be obtained), MOS-transistors which are used in logic circuits have a gate oxide about 3 nm in thickness, for example, MOS-transistors which are used for handling higher voltages have a gate oxide having a thickness of about 7.5 nm, and memory transistors have a gate oxide having a thickness of about 10 nm under a floating gate.

From EP 0 966 036 A2 a method of the kind referred to in the introduction is known, in which the gate electrodes for the MOS-transistors of the first type are formed in the layer of electrode material simultaneously with those for the MOS-transistors of the second type. The layer of electrode material, in this case a layer which is composed of a layer of polycrystalline silicon, on which a layer of, for example, titanium silicide and a top layer of silicon nitride are deposited, is formed on a layer of gate oxide 6 nm in thickness. After the formation of the gate electrodes for the two types of MOS-transistors, the thermal oxidation treatment is carried out. In order to obtain gate oxides of different thicknesses for the two aforesaid types of MOS-transistors, relatively large active regions are used for the MOS-transistors of the first type and relatively small active regions are used for the MOS-transistors of the second type. The gate electrodes for the MOS-transistors having the thin gate oxide are formed on relatively large active regions; the gate electrodes for the MOS-transistors having the thick gate oxide are formed on relatively small active regions. It becomes apparent in that case that when the thickness of the gate oxide under the gate electrodes on the relatively small active regions increases during the oxidation treatment from, for example, the original 6 nm to a thickness of 10 nm, the thickness of the gate oxide under the gate electrodes on the large active regions hardly changes at all, only increasing to a thickness of 7 nm.

A drawback of this known method is the fact that the thickness of the gate oxide formed under the gate electrodes depends on the dimensions of the active regions on which said gate electrodes have been formed. A particular drawback is the fact that the MOS-transistors having the thinnest gate oxide require the largest active regions, and that MOS-transistors having the thickest gate oxide require the smallest active regions. Circuits that operate on a low supply voltage of, for example, 1.8 V, such as microprocessors, comprise many relatively small MOS-transistors having a relatively thin gate oxide; circuits that operate on a higher voltage of, for example, 5 V, such as I-O gates, comprise few relatively large MOS-transistors having a relatively thick gate oxide. Consequently, such circuits can only be combined on a silicon body by sacrificing a relatively large amount of space when using the known method.

The object of the invention is to provide a method by means of which it is possible to manufacture a semiconductor device comprising MOS-transistors having gate oxides of different thicknesses, in which the realization of gate oxides of different thicknesses takes place independently of the dimensions of the active regions, and by means of which it is possible to produce small MOS-transistors having a thin gate oxide and large MOS-transistors having a thick gate oxide.

In order to achieve that object, the method according to the invention is characterized in that the layer of electrode material on the active regions of the MOS-transistors of the first type is not disturbed during the formation of the gate electrodes for the MOS-transistors of the second type, and that the gate electrodes for the MOS-transistors of the first type are only formed therein after the oxidation treatment in which the thickness of the gate oxide of the MOS-transistors of the second type is increased to the second, greater thickness. The original layer of gate oxide, which may have a thickness of, for example, 3 nm is covered by the layer of electrode material at the location of the MOS-transistors of the type having the thin gate oxide during the oxidation treatment, during which treatment its thickness will not change. The layer under the gate electrodes of the MOS-transistors of the type having the thick gate oxide becomes thicker. The thickness of the layer can be increased to a desired thickness of, for example, 7.5 nm independently of the dimension of the active region of said transistors. If the gate electrodes of the transistors of the type having the thin gate oxide are formed after the oxidation treatment, the said MOS-transistors will have a gate oxide having a thickness of 3 nm.

A semiconductor device comprising MOS-transistors having gate oxides of three different thicknesses can be realized in a simple manner if gate electrodes for a third type of MOS-transistor having a gate oxide of a third thickness greater than the aforesaid second thickness are formed in the layer of electrode material before the gate electrodes of the transistors of the second type are formed, after which the desired third thickness of the gate oxide under said gate electrodes is realized by means of a thermal oxidation treatment which is carried out before the gate electrodes of the transistors of the second type are formed in combination with the thermal oxidation treatment that is carried out subsequently. During the first oxidation treatment, the thickness of the gate oxide under the gate electrodes of the MOS-transistors of the third type, i.e. the type having the thickest gate oxide, is increased from a thickness of 3 $\mu$m to a thickness of 5.5 nm, for example. During the second oxidation treatment, in which the thickness of the gate oxide under the gate electrodes of the MOS-transistors of the second type, i.e. the type with the medium thickness gate oxide, is increased to a thickness of 7.5 nm, also the thickness of the gate oxide under the gate electrodes of the transistors having the thickest gate oxide is increased from the already larger thickness of 5.5 nm to a thickness of 10 nm. The MOS-transistors of the first type, the type having the thinnest gate oxide, have the original gate oxide having a thickness of 3 nm. Thus, MOS-transistors having a gate oxide having a thickness of 3 nm, 7.5 nm and 10 nm have been formed in a simple manner.

A semiconductor device comprising MOS transistors having gate oxides of even more different thicknesses can be realized in a simple manner if gate electrodes for other types of MOS-transistors having a gate oxide of a thickness larger than the third thickness are formed in the layer of electrode material before the gate electrodes of the transistors of the third type are formed, in which the gate electrodes for the transistors having the thickest gate oxide are formed first and the gate electrodes for the transistors having thinner gate oxides are formed next in separate process steps, in which oxidation treatments are carried out between said process steps and in which the desired thickness of the gate oxides for all MOS-transistors is realized cumulatively and in steps. Thus, it is possible to form MOS-transistors having gate oxides of many different thicknesses on the silicon body.

During the oxidation treatments, the gate oxide under the gate electrodes increases in thickness from the edges. In the case of relatively wide gate electrodes, the gate oxide will be thicker under the edges of said gate electrodes than in the center; oxidants such as oxygen and water have difficulty reaching the center of the gate electrodes. In the case of relatively narrow gate electrodes, the gate oxide in the center of the gate electrodes grows at the same rate as at the edges, because in this case the oxidants are capable of reaching the center from both sides of the gate electrode. In that case, a gate oxide of practically homogeneous thickness is obtained under the gate electrodes. Preferably, the gate electrodes of the MOS-transistors have a width of less than 350 nm, because it is possible to realize gate oxides of the said homogeneous thickness in that case.

The oxidation treatments can be carried out in many ways, using different temperatures and different oxidizing atmospheres. Preferably, the thermal oxidation treatment is a treatment in which the silicon body is heated to a temperature between 750° C. and 850° C. in a water vapor-containing atmosphere. The formation of the gate oxides can be readily controlled in that case. In the aforesaid example, in which gate oxides of 3 nm, 7.5 nm and 10 nm were formed, two oxidation treatments were carried out. In the first treatment, the thickness of the original gate oxide was increased from 3 nm to a greater thickness of 5.5 nm at the location of the MOS-transistors of the third type, and in the second oxidation treatment this thickness was increased to 10 nm, with the thickness of the gate oxide under the gate electrodes of the MOS-transistors of the second type being increased to 7.5 nm. Both oxidation treatments last about 30 minutes if the preferred treatment is used.

The invention will now be explained in more detail by way of example with reference to a figure, in which:

FIGS. 6–13 are diagrammatic cross-sectional views of a few stages of the manufacture of a second embodiment of a semiconductor device comprising MOS-transistors having gate oxides of different thicknesses, using the method according to the invention.

Figure 1:
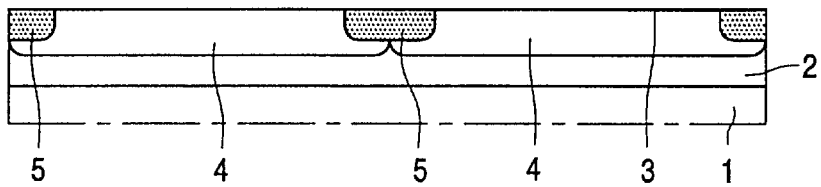
FIGS. 1–5 are diagrammatic cross-sectional views of a few stages of the manufacture of a first embodiment of a semiconductor device comprising MOS-transistors having gate oxides of different thicknesses, using the method according to the invention.

FIGS. 1–5 are diagrammatic cross-sectional views of a few stages of the manufacture of a first embodiment of a semiconductor device comprising MOS-transistors of a first type A having a gate oxide of a first thickness and MOS-transistors of a second type B having a gate oxide of a second, greater thickness. In this method, active regions 4 and field oxide regions 5 isolating said active regions from each other are first formed in a usual manner in a silicon body 1, adjacently to a surface 3 thereof, as is shown in FIG. 1. In this example a usual, relatively heavily doped p-type silicon body 1 coated with an epitaxially grown, less heavily doped p-type top layer 2 is used as the starting material. The active regions 4 are formed in a usual manner by means of ion implantation. The dopings introduced into the regions are selected in dependence on the type of transistor that is to be formed in said regions.

In practice, the semiconductor device will comprise an integrated circuit including circuits for different functions. In order to realize these functions, MOS-transistors having gate oxides of different thicknesses are required. In this example, the manufacture of a first type of MOS-transistor A having a gate oxide 3 nm in thickness and the manufacture of a second type of MOS-transistor B having a gate oxide 7.5 nm in thickness are shown beside each other for the sake of clarity. It will be understood that in practice these transistors will be used in different circuits, in which case they will not be arranged beside one another, as is the case in the drawing. The MOS-transistors of the first type are used in logic circuits, for example, which are operated at a low supply voltage of, for example, 1.8 V, the transistors of the second type are used in circuits for inputting and outputting data, for example, which are operated at a higher supply voltage of, for example, 5 V.

Figure 2:
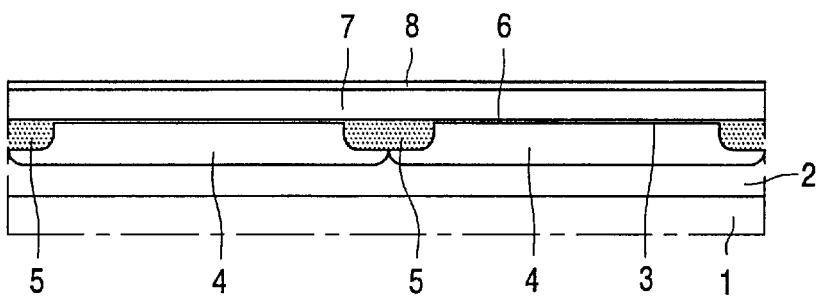

After the active regions 4 and the field oxide regions 5 have been formed so as to be adjacent to the surface 3, a layer of gate oxide 6 of the aforesaid first thickness, in this example a layer having a thickness of 3 nm, is formed on the active regions 4 in a usual manner by thermal oxidation, as is shown in FIG. 2. Subsequently, a layer of electrode material 7, 8, in this example an approximately 500 nm-thick layer of n-type doped polycrystalline silicon coated with an approximately 10 nm-thick top layer of silicon nitride, is deposited on the surface 3.

Figure 3:
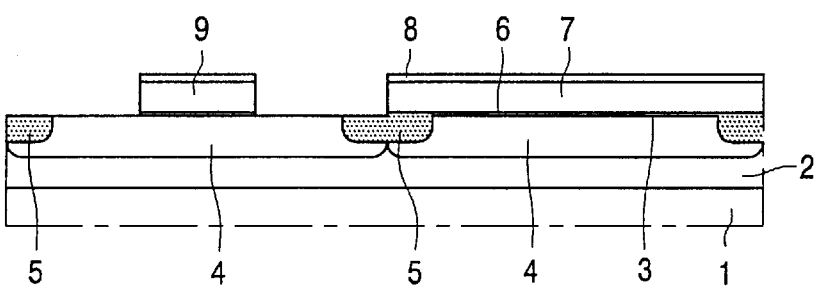
Figure 4:
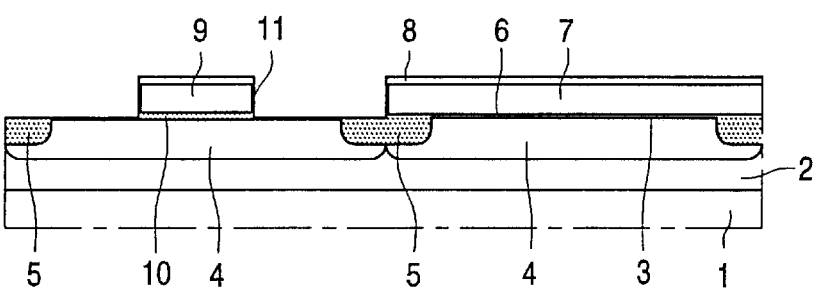

Subsequently, gate electrodes 9 for the MOS-transistors B of the second type are formed in the layer of electrode material 7, 8, as is shown in FIG. 3, after which the thickness of the gate oxide 6 under said gate electrodes 9 is increased to the second, greater thickness by means of a thermal oxidation treatment, as is shown in FIG. 4. In this example, the thickness of the gate oxide 10 under the gate electrodes 9 is increased to a thickness of 7.5 nm. During this oxidation treatment, an approximately 10 nm-thick layer of silicon oxide 11 is also formed on the edges of the gate electrodes 9.

Figure 5:
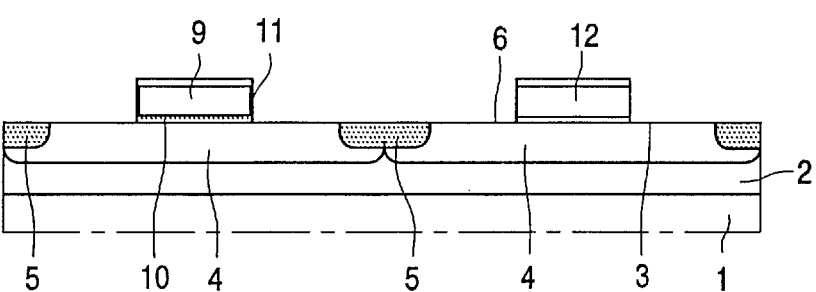

As is shown in FIGS. 3 and 4, the electrode layer 7, 8 on the active regions of the MOS-transistors of the first type A is not disturbed during the formation of the gate electrodes 9 for the MOS-transistors of the second type B. The gate electrodes 12 for the MOS-transistors of the first type A are only formed therein after completion of the oxidation treatment in which the thickness of the gate oxide 10 of the MOS-transistors of the second type has been increased to the second, greater thickness, as is shown in FIG. 5.

The original layer of gate oxide 6, which has a thickness of 3 nm in this case, is covered by the layer of electrode material 7, 8 at the location of the MOS-transistors A, i.e. the type having the thin gate oxide, during the oxidation treatment, and its thickness does not change during this treatment. The thickness of the layer under the gate electrodes of the MOS-transistors B, i.e. the type having the thick gate oxide, increases to a thickness of 7.5 nm in this case. This method renders it possible to manufacture a semiconductor device comprising MOS-transistors having gate oxides of different thicknesses, in which the formation of gate oxides of different thicknesses takes place independently of the dimensions of the active regions, and small MOS-transistors having a thin gate oxide and large MOS-transistors having a thick gate oxide can be produced.

FIGS. 6–13 diagrammatically show in cross-section a few stages of the manufacture of a second embodiment of a semiconductor device comprising MOS-transistors of a first type A having a gate oxide of a first thickness and MOS-transistors of a second type B having a gate oxide of a second, greater thickness and MOS-transistors of a third type C having a gate oxide of an even greater thickness, in this example 10 nm. In the description of the second example, the same reference numerals as in the above-described first example will be used in those cases where this is possible. Also in this example, active regions 4 and field oxide regions 5 are formed in the silicon body 1 so as to be adjacent to the surface 3 on which the layer of gate oxide 6 and the layer of electrode material 7, 8 are formed, as is shown in FIGS. 6 and 7.

Figure 10:
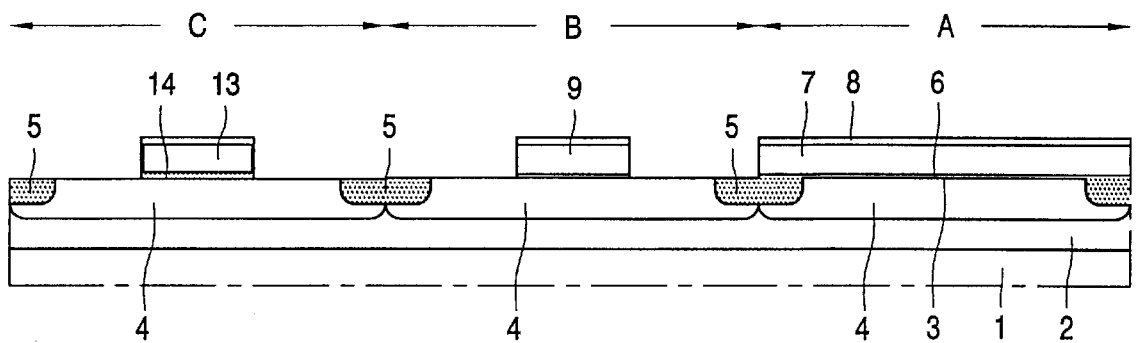
Figure 11:
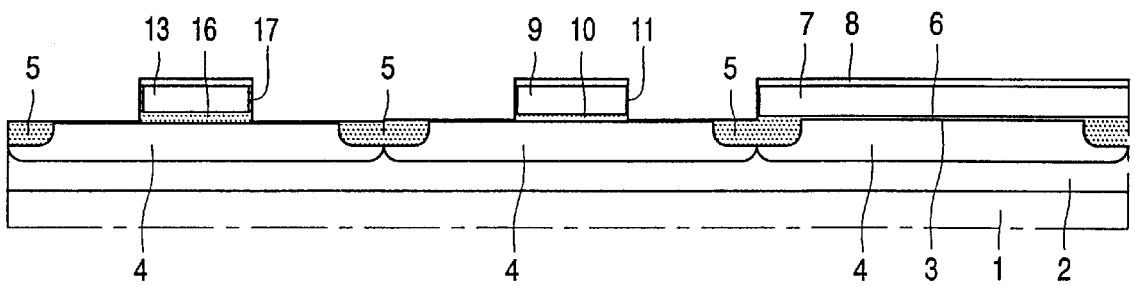
Figure 12:
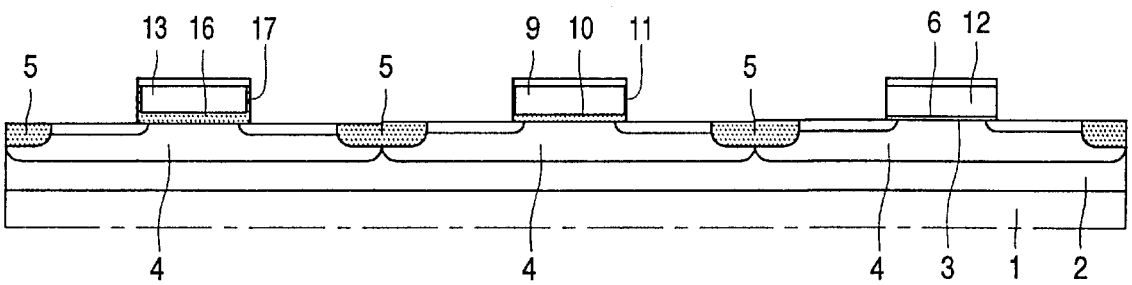

Before the gate electrodes 9 of the transistors B of the second type are formed, gate electrodes 13 for a third type of MOS-transistor C having a gate oxide of a third thickness greater than the aforesaid second thickness, in this case 10 nm, are formed in the layer of electrode material 7, 8, as is shown in FIG. 8. Then a first thermal oxidation treatment is carried out, in which the thickness of the gate oxide 6 under the gate electrodes 13 is increased, in this case to a thickness of about 5.5 nm, as is shown in FIG. 9. Next, as is shown in FIG. 10, the gate electrodes 9 are formed and a second oxidation treatment is carried out, in which the desired thickness of 10 nm of the gate oxide 15 under the gate electrodes 13 and the desired thickness of 7.5 nm of the gate oxide 6 under the gate electrodes 9 are realized, as is shown in FIG. 11. Finally, as is shown in FIG. 12, the gate electrodes 12 are formed. The first and the second oxidation treatment together result in the desired thickness of 10 nm of the gate oxide 16 under the gate electrodes 13. The walls of the gate electrodes 13 are provided with a layer 17 of silicon oxide about 20 nm in thickness by means of the two thermal treatments. Using the method as described above, MOS-transistors A, B and C having gate oxides 3 nm, 7.5 nm and 10 nm in thickness, respectively, have been formed in a simple manner.

It will be understood that the method can easily be extended so as to form a semiconductor device comprising MOS-transistors having gate oxides of even more different thicknesses. This can be realized if gate electrodes for other types of MOS-transistors having a gate oxide of a thickness larger than the third thickness are formed in the layer of electrode material before the gate electrodes of the transistors of the third type are formed, in which the gate electrodes for the transistors having the thickest gate oxide are formed first and the gate electrodes for the transistors having thinner gate oxides are formed next in separate process steps, with oxidation treatments being carried out between said process steps, in which the desired thickness of the gate oxides is formed cumulatively and in steps for all MOS-transistors.

During the aforesaid oxidation treatments, the gate oxide 6 under the gate electrodes 9, 12 and 13 increases in thickness from the edges. In the case of relatively wide gate electrodes, the gate oxide will be thicker under the edges of said gate electrodes than in the center of the gate electrodes; oxidants such as oxygen and water have difficulty reaching the center. In the case of relatively narrow gate electrodes, the growth of the gate oxide in the center of the gate electrodes takes place at the same rate as at their edges, because the oxidants can reach this center from both sides of the gate electrode in that case. In that case a gate oxide of a practically homogeneous thickness is formed under the gate electrodes. Preferably, the gate electrodes 9, 12 and 13 of the MOS-transistors have a width (i.e. the dimension in the plane of drawing; the gate electrodes have a relatively greater length of, for example, a few $\mu$m, in the direction transverse to the plane of drawing) of less than 350 nm, because gate oxides having the aforesaid homogeneous thickness will be realized in that case.

Preferably, however, a layer of non-crystalline silicon 7 coated with a top layer 8 of silicon nitride is deposited as the electrode layer 7, 8. If a layer of polycrystalline or amorphous silicon is used, the formation of the thicker layers of gate oxide 10, 14 and 16 will be accelerated, because the gate oxide is not only formed as a result of oxidation of the silicon of the silicon body adjacent to the surface 3 in that case, but also as a result of oxidation of the silicon of the gate electrodes 9 and 13. The top layer of silicon nitride 8 provides additional protection for the gate oxide 6 under the electrode layer 7, 8 during the oxidation treatments.

Figure 13:
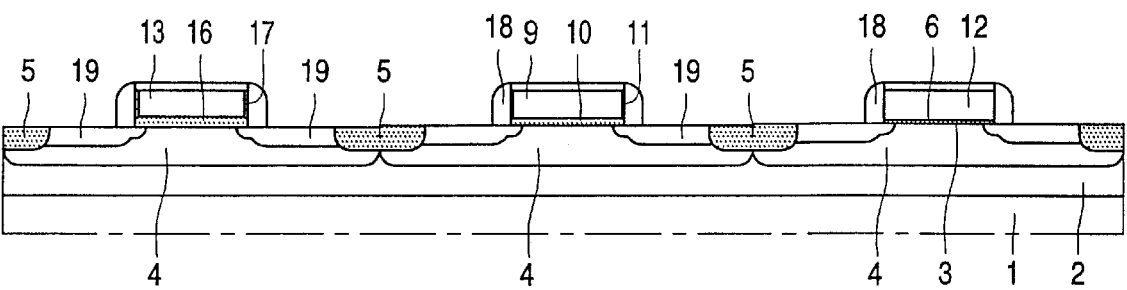

As is shown in FIG. 13, the gate electrodes 9, 12 and 13 are furthermore provided with a sidewall insulation 18, and source and drain zones 19 are formed in the active regions 4 in a usual manner.

The oxidation treatments can be carried out in many ways, using different temperatures and different oxidizing atmospheres. Preferably, the thermal oxidation treatment is a treatment in which the silicon body is heated to a temperature between 750° C. and 850° C. in a water vapor-containing atmosphere. The formation of the gate oxides can be readily controlled in those conditions. In the aforesaid example, in which gate oxides 3 nm, 7.5 nm and 10 nm in thickness were formed, two oxidation treatments were carried out. In the first treatment, at the location of the MOS-transistors of the third type, the thickness of the original gate oxide was increased from a thickness of 3 nm to a greater thickness of 5.5 nm, and in the second oxidation treatment said thickness was increased to 10 nm, with the thickness of the gate oxide under the gate electrodes of the MOS transistors of the second type being increased to a thickness of 7.5 nm. Both oxidation treatments last approximately 30 minutes if the preferred treatment is used.

What is claimed is:

1. A method of manufacturing a semiconductor device comprising MOS-transistors of a first type having a gate oxide of a first thickness and MOS-transistors of a second type having a gate oxide of a second, greater thickness, in which method active regions and field oxide regions isolating said active regions from each other are formed in a silicon body, adjacently to a surface thereof, after which a layer of gate oxide of said first thickness is formed on said active regions, on which a layer of an electrode material is deposited, in which the gate electrodes for the MOS-transistors of said second type are formed, including removing the layer, of gate oxide of said first thickness around the MOS-transistor of the second type, after which the thickness of the gate oxide under said gate-electrodes is increased to the second, larger thickness by means of a thermal oxidation treatment, characterized in that the layer of electrode material on the active regions of the MOS-transistors of the first type is not disturbed during the formation of the gate electrodes for the MOS-transistors of the second type, and that the gate electrodes for the MOS-transistors of the first type are only formed therein after the oxidation treatment in which the thickness of the gate oxide of the MOS-transistors of the second type is increased to the second, greater thickness.

2. A method as claimed in claim 1, characterized in that gate electrodes for a third type of MOS-transistor having a gate oxide of a third thickness greater than the aforesaid second thickness are formed in the layer of electrode material before the gate electrodes of the transistors of the second type are formed, after which the desired third thickness of the gate oxide under said gate electrodes is realized by means of a thermal oxidation treatment which is carried out before the gate electrodes of the transistors of the second type are formed in combination with the thermal oxidation treatment that is carried out subsequently.

3. A method as claimed in claim 2, characterized in that gate electrodes for other types of MOS-transistors having a gate oxide of a thickness larger than the third thickness are formed in the layer of electrode material before the gate electrodes of the transistors of the third type are formed, in which the gate electrodes for the transistors having the thickest gate oxide are formed first and the gate electrodes for the transistors having thinner gate oxides are formed next in separate process steps, in which oxidation treatments are carried out between said process steps and in which the desired thickness of the gate oxides for all MOS-transistors is realized cumulatively and in steps.

4. A method as claimed in claim 1, characterized in that the gate electrodes of the MOS-transistors have a width of less than 350 nm.

5. A method as claimed in any claim 1, characterized in that a layer of non-crystalline silicon coated with a top layer of silicon nitride is deposited as the layer of electrode material.

6. A method as claimed in claim 1, characterized in that the thermal oxidation treatment is a treatment in which the silicon body is heated to a temperature between 750° C. and 850° C. in a water vapor-containing atmosphere.

* * * * *